(12) United States Patent  (10) Patent No.: US 7,794,115 B2
Hellinger et al.  (45) Date of Patent: Sep. 14, 2010

(54) ILLUMINATION UNIT

(75) Inventors: Leopold Hellinger, Ziersdorf (AT);
Gerhard Neumann, St. Margarethen (AT)

(73) Assignee: Siemens AG Österreich, Vienna (AT)

( * ) Notice: Subject to any disclaimer, the term of this patent is extended or adjusted under 35 U.S.C. 154(b) by 47 days.

(21) Appl. No.: 12/154,023

(22) Filed: May 20, 2008

(65) Prior Publication Data
US 2008/0291631 A1  Nov. 27, 2008

(30) Foreign Application Priority Data
May 23, 2007 (DE) .................. 10 2007 023 918

(51) Int. Cl.
*F21V 29/00* (2006.01)
(52) U.S. Cl. .................. 362/294; 362/373; 362/800; 362/249.02
(58) Field of Classification Search .................. 362/373, 362/294, 800, 249.02
See application file for complete search history.

(56) References Cited

U.S. PATENT DOCUMENTS

| | | | | |
|---|---|---|---|---|
| 6,641,284 B2* | 11/2003 | Stopa et al. | .................. | 362/240 |
| 6,871,983 B2* | 3/2005 | Jacob et al. | .................. | 362/364 |
| 7,300,195 B2* | 11/2007 | Lindbeck et al. | ............ | 366/111 |
| 7,374,316 B2* | 5/2008 | Kuo et al. | .................... | 362/373 |
| 7,497,596 B2* | 3/2009 | Ge | .............................. | 362/294 |
| 7,540,761 B2* | 6/2009 | Weber et al. | ................. | 439/487 |
| 7,547,124 B2* | 6/2009 | Chang et al. | ................. | 362/373 |
| 7,566,147 B2* | 7/2009 | Wilcox et al. | .......... | 362/249.02 |
| 7,654,691 B2* | 2/2010 | Liu et al. | ............... | 362/249.02 |
| 7,699,498 B2* | 4/2010 | Zheng | ................... | 362/249.02 |

FOREIGN PATENT DOCUMENTS

| DE | 199 17 401 | A1 | 10/2000 |
|---|---|---|---|
| DE | 199 22 176 | C2 | 11/2000 |
| DE | 101 17 889 | A1 | 10/2002 |
| DE | 10 2004 001 124 | B3 | 10/2005 |
| DE | 10 2004 016 847 | A1 | 12/2005 |

* cited by examiner

*Primary Examiner*—Anabel M Ton

(57) ABSTRACT

There is described an illumination unit with a planar carrier part having a plurality of light-emitting semiconductor components, in particular high-power light-emitting diodes, arranged on both sides of a main surface. On each side of the carrier part a heat sink is provided in each case. Each of the semiconductor components is connected in an efficient heat-conducting manner to a heat sink provided on an opposite side of the carrier part by way of a heat conducting means that is fed through an opening in the carrier part. At least one reflector is embodied on each heat sink having a reflective surface which concentrates the emitted light from a semiconductor component which is arranged on the side of the carrier part facing this heat sink.

15 Claims, 6 Drawing Sheets

ILLUMINATION UNIT

CROSS REFERENCE TO RELATED APPLICATIONS

This application claims priority of German application No. 10 2007 023 918.3 DE filed May 23, 2007, which is incorporated by reference herein in its entirety.

FIELD OF INVENTION

The invention relates to an illumination unit with a planar carrier part having a plurality of light-emitting semiconductor components, in particular high-power light-emitting diodes, arranged on each of the two sides and with a heat sink being provided on each side of said carrier part.

BACKGROUND OF INVENTION

It is known that in motor vehicles various illumination devices, such as flashing lights, are used in which light is emitted in both a forward and a backward direction. Nowadays, semiconductor components, in particular high-power light-emitting diodes (LEDs), are used as light-emitting components, as is known for example from DE 101 17 889 A1. The power consumption of these high-power LEDs is generally between 1 and 3 W or higher, which means that it is essential to make arrangements for removal of heat. Usually these high-power light-emitting diodes are arranged on two separate printed circuit boards. The concentration of the emitted rays takes place in known devices in each case by means of separate reflectors on the front and on the rear side. In order to dissipate the heat that occurs during operation, the practice of providing a heat sink between the printed circuit boards is known. This is however costly and requires a corresponding volume for the assembly.

From DE 199 22 176 C2 a surface-mounted LED arrangement is known, in which a printed circuit board is installed on a heat sink with its side facing away from the LEDs, whereby heat dissipation is encouraged toward the rear. This arrangement means however that light is radiated in only one direction.

SUMMARY OF INVENTION

An object of the present invention is therefore to achieve improved heat dissipation as easily as possible for an illumination unit in which a plurality of light-emitting semiconductor components are arranged on both main surfaces of a planar carrier part.

This object is achieved by an illumination unit having the features of an independent claim. Advantageous developments of the invention are the subject of the dependent claims.

In an illumination unit with a planar carrier part having a plurality of light-emitting semiconductor components, in particular high-power light-emitting diodes, arranged on each of the two sides and in which a heat sink is provided on each side of the carrier part, there is provision according to the invention for each semiconductor component to be connected to the heat sink provided on the side of the carrier part opposite the semiconductor component in an efficient heat conducting manner by means of a heat conducting means that is taken through a via of the carrier part, and at least one reflector to be embodied on each of the heat sinks having a reflective surface which concentrates the light emitted from a semiconductor component which is arranged on the side of the carrier part facing this heat sink.

This means that one component handles both the cooling function and the function of concentrating the light rays. This simplifies the construction considerably. Compared with conventional designs known previously there are no costs for the second printed circuit board or for separate reflectors. The illumination unit requires comparatively little space overall and is comparatively light in weight. The direct removal of heat to a heat sink provided on the opposite side of the carrier part has the advantage that a comparatively larger heat transfer surface can be used. As a result the high-power light-emitting diodes can be operated with a higher current, thus achieving greater optical power.

The carrier part can be a conventional printed circuit board, for example a rigid FR4 printed circuit board or a flat ceramic substrate. The carrier part can also be a curved design formed by a flexible printed circuit board, made for example of polyimide. Depending on the design of the carrier part, the heat conducting means serving to transfer heat to the opposite side of the carrier part can be designed differently, for example in a rigid carrier in the form of a plate by conventional through-connection or by a metallic insert that is introduced into an opening of the carrier part flush with the surface. For the design of the reflective surface various surface treatment methods are available, such as the application of a reflective high-gloss layer.

It can be advantageous if each semiconductor component arranged on a main surface is assigned a reflector which is embodied on a heat sink lying adjacent to said main surface.

For cost-effective manufacture, it can be convenient if each heat sink and each reflector embodied on said heat sink is manufactured in one-piece and made of the same material that conducts heat well, such as metal. This integral component that serves both to cool the semiconductor components and to direct the emitted light can be manufactured cost-effectively in large numbers, for example using injection molding.

In order to concentrate the rays of light in a desired ray direction the reflector can be designed for example as a spherical concave mirror or as a parabolic mirror, an assigned light-emitting semiconductor component being arranged in its focal plane.

A cost-effective embodiment with efficient heat removal can be designed such that the carrier part is a printed circuit board on which the semiconductor components—seen in one view through the plane of the printed circuit board—are equidistantly spaced in each case. The offset between the components on the front and those on the rear side favors transfer of heat to the heat sink of the opposite carrier part in each case.

The transfer of heat through the printed circuit board can be embodied advantageously as thermal through-connections, so called "thermal vias". These "thermal vias" consist of solder-filled drilled holes and are handled in the manufacturing process of a printed circuit board largely like electrical through-connections. They lie with one end against the semiconductor component and are connected at the other end to a heat-conducting layer which is embodied on the opposing main surface of the carrier part. The heat-conducting layer can be a copper layer, for example.

So as to keep the weight low, it is advantageous if each heat sink is designed as a molded body having supports, which are supported in an assembled state in each case on one of these heat-conducting layers.

A particularly compact construction can be achieved when the semiconductor components are surface mounted on the main surfaces of the carrier part.

Good thermal decoupling between LEDs on the front and rear side can be achieved by each semiconductor component mounted on one of the main surfaces being kept apart from the heat sink facing this main surface by an annular clearance. If the LEDs on the front and rear side are not operated at the same time, the operating temperature is consequently lower.

For a flashing light in a motor vehicle an illumination unit can be advantageous in which a number of reflectors are embodied on each of the heat sinks such that the neighboring radiation pattern overlaps.

With regard to heat removal it can be advantageous, if in a heat sink the reflector and the cooling fins are embodied from the same material and the cooling fins extend in the direction in which light is radiated.

Depending on the desired light intensity a varying number of LEDs on the front and rear side of the carrier part can be advantageous.

BRIEF DESCRIPTION OF THE DRAWINGS

For further explanation of the invention reference is made to the drawings in the following part of the description from which further advantageous embodiments, details and developments of the invention can be derived.

These show.

DETAILED DESCRIPTION OF INVENTION

Figure 1:
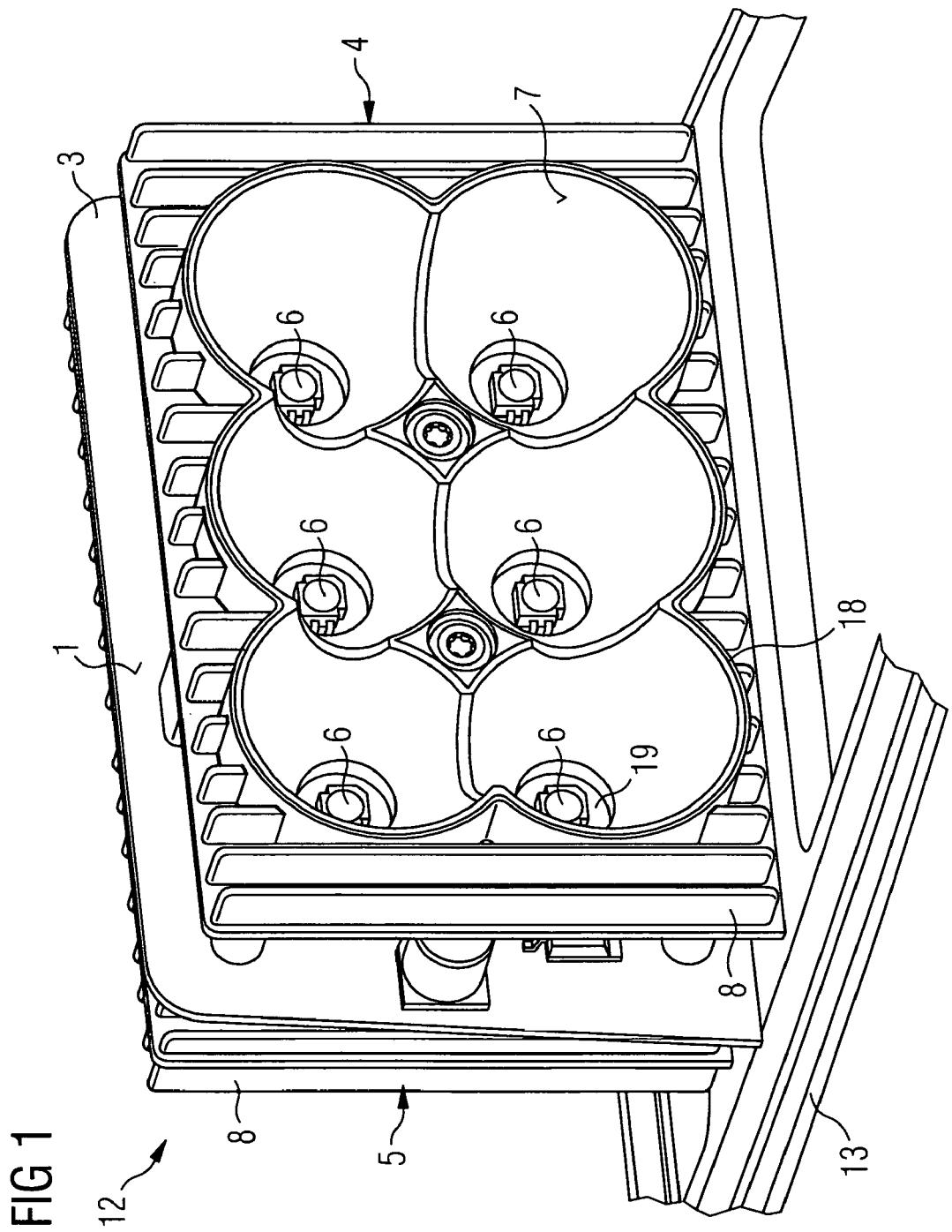
FIG. 1—the front view of an illumination unit according to the invention in an assembled state.
Figure 2:
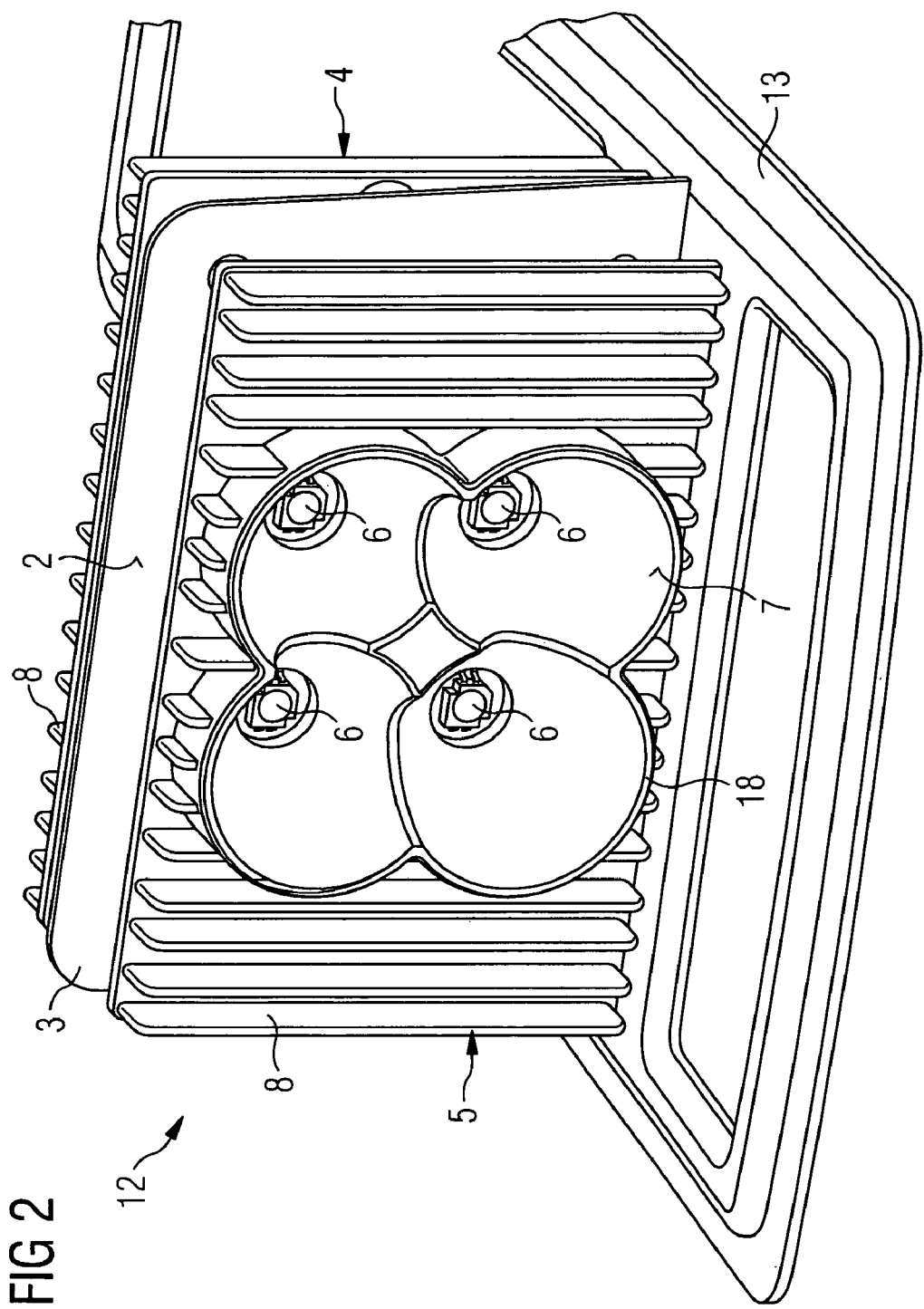
FIG. 2—the rear view of an illumination unit according to the invention in an assembled state.

FIGS. 1 and 2 show an exemplary embodiment of the inventive illumination device in a spatial representation viewed from the front and from the rear. The illumination unit as a whole has the reference number 12. In the present example, it consists essentially of a printed circuit board 3, equipped on both sides with high-power light-emitting diodes 6 and held together in the form of a sandwich between two heat sinks 4,5 by means of fastening bolts 20. Each heat sink consists of cooling fins 8. These cooling fins 8 point in each case in the direction in which light is radiated from the reflectors 18 which are embodied on each heat sink 4 and 5. The heat sink 4 or 5 forms together with the respective reflector 18 a constructional unit which performs in each case the dual function of heat dissipation and guidance of light rays. The heat sinks 4 or 5 in this example are arranged as injection molded bodies made from metal and arranged on a baseplate 13.

Figure 3:
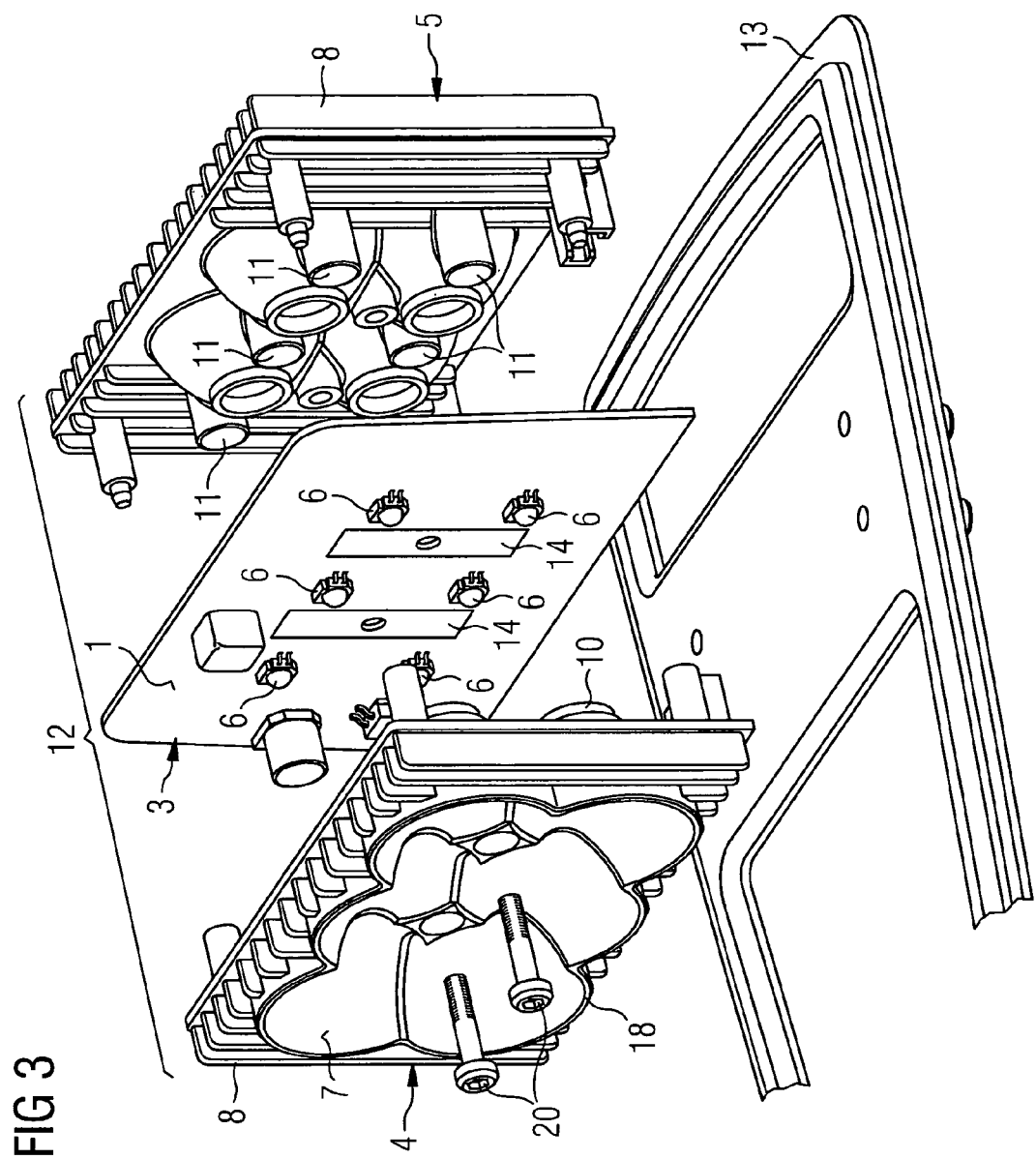
FIG. 3—the illumination unit according to the invention seen from above.
Figure 4:
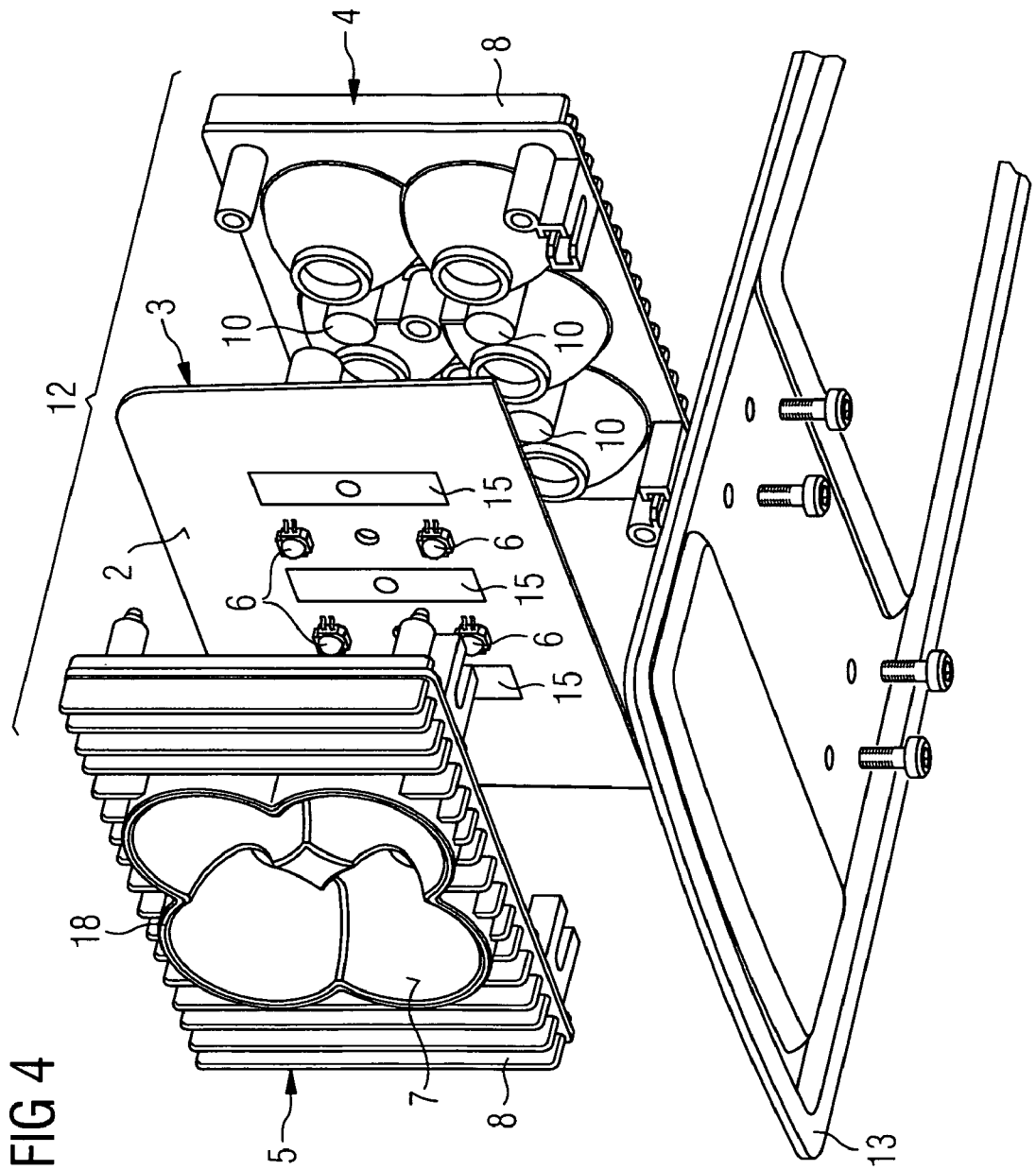
FIG. 4—an exploded drawing of the illumination unit according to the invention seen at an angle from below.

As is best seen from the exploded illustration in FIG. 3 and FIG. 4, each heat sink 4,5 has one support 10 or 11 in each case. Each of these supports 10 or 11 serves to remove the heat from the respective high-power light-emitting diode lying opposite, which is described in more detail in the following:

In an assembled state each support 10 of the heat sink 4 comes into contact with a heat transfer surface 14, in the present case a copper layer, which is embodied on the main surface 1 of the printed circuit board 3.

As can be seen easily from FIG. 3, two of these heat-conducting layers 14 are located on the main surface 1. The heat-conducting layers 14 are on the other hand connected to the four high power light-emitting diodes 6 arranged on the second main surface 2 (see FIG. 4) of the printed circuit board 3 in an efficient heat-conducting manner by means of thermal vias. In this way during operation of the four LEDs, heat that accumulates is transferred to the heat sink 4 facing the first main surface 1 and from there it is dissipated to the outside.

Correspondingly in an assembled state, each support 11 of the heat sink at the back 5 rests against the heat transfer surface 15 which is shown best in FIG. 4. The heat conducting layer 15 is once again a copper layer which in a manner known per se is embodied on the second main surface 2 of the printed circuit board 3. Three of these heat conducting layers 15 are embodied on the reverse side 2. Each of these layers 15 is thermally connected to a pair of six high-power light-emitting diodes 6 (see FIG. 3) on the front side 1 of the printed circuit board 3. The thermal connection is again made by means of so-called "thermal vias". In an assembled state, the heat from these six high-power light-emitting diodes 6 arranged on the front side 1 of the printed circuit board 3 is removed by the heat sink at the back 5.

Expressed in other words, the heat from each high-power light-emitting diode on one side is removed by a heat sink arranged on the other side which at the same time is a reflector for LEDs which are arranged on the main surface facing said heat sink.

Figure 5:
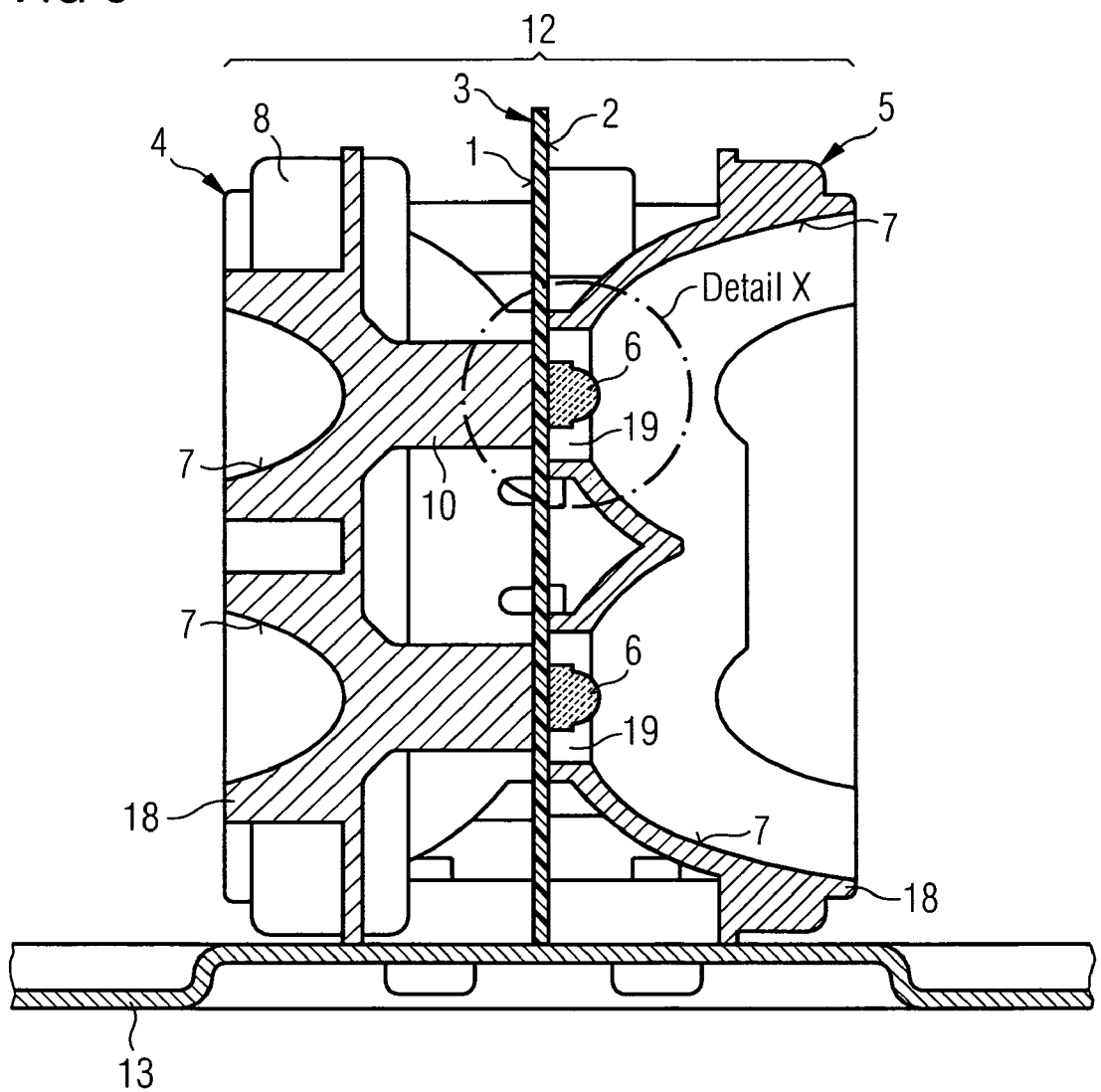
FIG. 5—a sectional drawing of the illumination unit according to the invention.

This inventive concept for removing heat is illustrated in FIG. 5 in a sectional drawing. The drawing shows a cross-section of two high-power light-emitting diodes 6 on the second main surface 2 of the printed circuit board 3. The electrical waste heat occurring is transferred through the printed circuit board 3 (see detail X in FIG. 6) to a support 10 of the molded heat sink 4 lying behind, the surface of which emits heat to the surrounding air.

Figure 6:
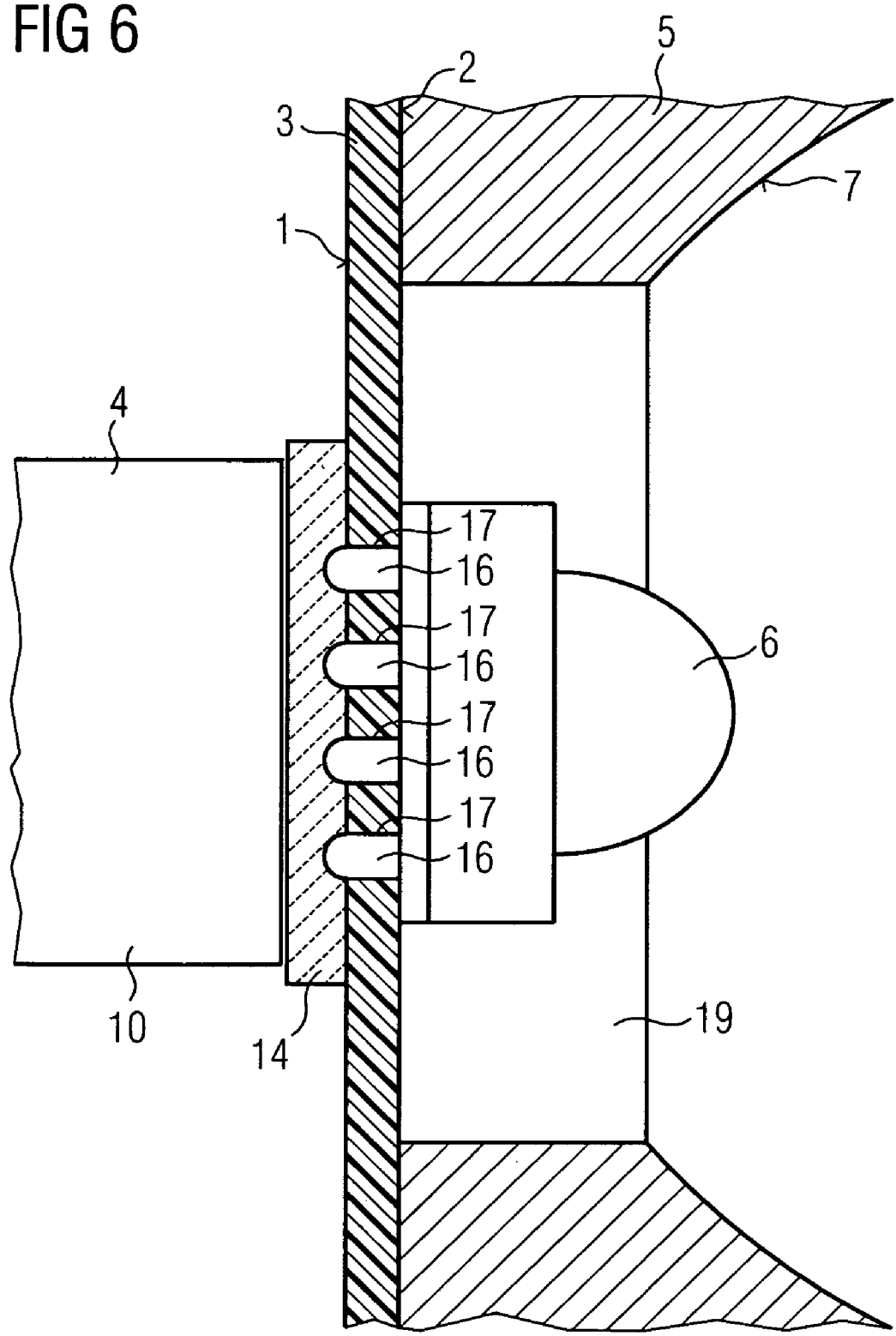
FIG. 6—an enlarged illustration of the detail X of FIG. 5.

In FIG. 6, the detail X of FIG. 5 is shown enlarged. The LED 6 is soldered to the second main surface 2 of the printed circuit board 3 by surface mounting. The printed circuit board 3 has several openings 17 embodied as drilled holes. These drilled holes 17 are solder-filled and form a thermal via 16. The LED 6 lies with its rear side against these metal-filled vias 16, whereby the heat generated in the LED 6 during operation is initially directed backwards onto the heat-conducting copper layer 14. A support 10 of a heat sink 4 is supported on the heat-conducting layer 14 which dissipates the heat generated in the LED 6. As already mentioned in the introduction, instead of the thermal via 16, a metallic insert through an opening of the printed circuit board 3 is also conceivable.

For the purposes of thermal decoupling, an annular clearance 19 is embodied between the LED 6 and the heat sink 5 facing the second main surface 2. A corresponding annular clearance 19 is also embodied between the LEDs on the main surface 1 and on the heat sink 4 (FIG. 1).

The invention claimed is:
1. An illumination unit, comprising:
a planar carrier part with opposite sides, each opposite side having a main surface;
a plurality of light-emitting semiconductor components arranged on the main surfaces of both opposite sides of the planar carrier part;
a heat sink on each side of the carrier part, wherein the semiconductor components on one side of the carrier part are thermally connected to the heat sink on the opposite side of the carrier part;
an opening in the carrier part, for a heat conducting device to provide the thermal connection; and at least one reflector on each heat sink, wherein the reflector has a reflective surface to concentrate light emitted from the semiconductor component which is arranged on this side of the carrier part facing this heat sink.

2. The illumination unit as claimed in claim 1, wherein the light-emitting semiconductor components are high-power light-emitting diodes, and wherein each of the semiconductor components is connected in an efficient heat/conducting manner to the heat sink provided on the opposite side of the carrier part.

3. The illumination unit as claimed in claim 1, wherein one reflector is assigned to each of the semiconductor components arranged on a main surface, wherein the reflector is on the heat sink facing the same main surface.

4. The illumination unit as claimed in claim 1, wherein each reflector embodied on one of the heat sinks is manufactured in one piece from the same material as said heat sink and is made of a metallic material.

5. The illumination unit as claimed in claim 3, wherein each reflector embodied on one of the heat sinks is manufactured in one piece from the same material as said heat sink and is made of a metallic material.

6. The illumination unit as claimed in claim 4, wherein each reflector is a part of a spherical concave mirror with an assigned semiconductor component arranged in its focal plane.

7. The illumination unit as claimed in claim 6, wherein a neighboring radiation pattern of a plurality of reflectors on at least one of the sides overlap.

8. The illumination unit as claimed in claim 3, wherein the carrier part is a printed circuit board, on which the semiconductor components are arranged equidistantly.

9. The illumination unit as claimed in claim 7, wherein the carrier part is a printed circuit board, on which the semiconductor components are arranged equidistantly.

10. The illumination unit as claimed in claim 8, wherein the semiconductor component on one side of the carrier part is thermally connected to the heat sink on the opposite side of the carrier part with a thermal via, which is connected at one end to the semiconductor component and at the opposite end to a heat-conducting layer on the main surface of the carrier part lying opposite said semiconductor component.

11. The illumination unit as claimed in claim 10, wherein in an assembled state on each heat-conducting layer at least one support of a heat sink facing a layer is supported in each case.

12. The illumination unit as claimed in claim 11, wherein the semiconductor components are mounted by surface mounting on the main surfaces of the carrier part.

13. The illumination unit as claimed in claim 12, wherein each of the semiconductor components mounted on a main surface is distanced from the heat sink facing this main surface by a clearance in each case.

14. The illumination unit as claimed in claim 13, wherein each heat sink has cooling fins.

15. The illumination unit as claimed in claim 13, wherein the number of semiconductor components on the first main surface is different from the number of semiconductor components on the second main surface.

* * * * *